United States Patent [19]

Houston et al.

[11] 4,115,850

[45] Sep. 19, 1978

[54] APPARATUS FOR PERFORMING AUXILIARY MANAGEMENT FUNCTIONS IN AN ASSOCIATIVE MEMORY DEVICE

[76] Inventors: George B. Houston, 742 Boylston Ave. E., Seattle, Wash. 98102; Roger H. Simonsen, 26840-8th Ave. S., Kent, Wash. 98031

[21] Appl. No.: 738,570

[22] Filed: Nov. 3, 1976

[51] Int. Cl.² ............................................. G06F 7/00
[52] U.S. Cl. ................................................. 364/200
[58] Field of Search ... 364/200 MS File, 900 MS File

[56] References Cited

U.S. PATENT DOCUMENTS

| | | | |
|---|---|---|---|
| 3,447,135 | 5/1969 | Calta et al. | 364/200 |
| 3,599,177 | 10/1971 | Jen et al. | 364/900 |
| 3,757,306 | 9/1973 | Boone | 364/200 |

*Primary Examiner*—Harvey E. Springborn

[57] ABSTRACT

Apparatus for managing data and data requests within an associative memory device, wherein the associative memory device is responsive to requests from one or more using devices, such as a digital computer, to store, locate, retrieve, and modify, by means of decision logic, specific data which is stored in peripheral memory. The apparatus includes a number of elements which individually are capable of performing a number of general-purpose functions, which are in turn combined in specified sequences to form special-purpose functions. The special purpose functions and several of the general-purpose functions together provide the necessary data management capability for the associative memory device.

10 Claims, 5 Drawing Figures

Fig. 1
Prior Art

| GENERAL PURPOSE FUNCTION | DATA SOURCE | DATA DESTINATION | DATA TRANSFERRED |
|---|---|---|---|
| CONTROL BUFFER WRITE | USING COMPUTER | CONTROL BUFFER | LOGICAL RECORD |
| CONTROL BUFFER READ | CONTROL BUFFER | USING COMPUTER | LOGICAL RECORD |
| GENERAL ASSOCIATIVE SEARCH | BORAM | CONTROL BUFFER | LOGICAL RECORD |
| DEVICE READ | BORAM | BLOCKING BUFFER | SECTOR (S) |
| DEVICE WRITE | BLOCKING BUFFER | BORAM | SECTOR (S) |
| DEVICE WRITE (INITIALIZATION) | INITIALIZING GENERATOR | BORAM | SECTOR (S) |
| BLOCKING BUFFER READ | BLOCKING BUFFER | CONTROL BUFFER | LOGICAL RECORD |
| BLOCKING BUFFER WRITE | CONTROL BUFFER | BLOCKING BUFFER | LOGICAL RECORD |
| UNLOAD FAST TRANSFER | BORAM | USING COMPUTER | SECTOR (S) |
| LOAD FAST TRANSFER | USING COMPUTER | BORAM | SECTOR (S) |

|   | SPECIAL-PURPOSE FUNCTIONS | GENERAL-PURPOSE FUNCTIONS |
|---|---|---|
|   | AREA | |
| A | INITIALIZE DEVICE AREA | 1 - DEVICE WRITE (INITIALIZATION) |
| B | UNLOAD/LOAD DEVICE AREA | 1 - UNLOAD/LOAD FAST TRANSFER |
|   | LOGICAL RECORD | |
| C | RETRIEVE RECORD (WITHOUT RESERVATION) | 1 - GENERAL ASSOCIATIVE SEARCH<br>2 - DEVICE READ<br>3 - BLOCKING BUFFER READ<br>4 - CONTROL BUFFER READ |
| D | RETRIEVE RECORD (WITH RESERVATION) | 1 - GENERAL ASSOCIATIVE SEARCH<br>2 - DEVICE READ<br>3 - BLOCKING BUFFER READ<br>4 - MODIFY FLAG AND IDENTIFIER FIELDS<br>5 - DEVICE WRITE<br>6 - CONTROL BUFFER READ |
| E | ADD RECORD | 1 - GENERAL ASSOCIATIVE SEARCH (FOR FLAG FIELD = FREE RECORD VALUE)<br>2 - DEVICE READ<br>3 - BLOCKING BUFFER WRITE<br>4 - SET FLAG AND IDENTIFIER FIELDS<br>5 - DEVICE WRITE |
| F | UPDATE RECORD | 1 - GENERAL ASSOCIATIVE SEARCH (FOR RESERVED RECORD)<br>2 - DEVICE READ<br>3 - BLOCKING BUFFER WRITE<br>4 - MODIFY FLAG AND IDENTIFIER FIELDS<br>5 - DEVICE WRITE |
| G | DELETE RECORD | 1 - GENERAL ASSOCIATIVE SEARCH (FOR RESERVED RECORD)<br>2 - DEVICE READ<br>3 - CLEAR RECORD SPACE IN BLOCKING BUFFER<br>4 - CLEAR FLAG AND IDENTIFIER FIELDS<br>5 - DEVICE WRITE |
| H | RESERVE RECORD (WITHOUT RETRIEVAL) | 1 - GENERAL ASSOCIATIVE SEARCH<br>2 - DEVICE READ<br>3 - MODIFY FLAG AND IDENTIFIER FIELDS<br>4 - DEVICE WRITE |
| I | PURGE RESERVATION | 1 - GENERAL ASSOCIATIVE SEARCH (FOR RESERVED RECORD(S))<br>2 - DEVICE READ<br>3 - MODIFY FLAG AND IDENTIFIER FIELDS<br>4 - DEVICE WRITE |
| J | CHANGE RESERVATION | 1 - GENERAL ASSOCIATIVE SEARCH (FOR RESERVED RECORD)<br>2 - DEVICE READ<br>3 - MODIFY FLAG AND IDENTIFIER FIELDS<br>4 - DEVICE WRITE |

Fig. 5

APPARATUS FOR PERFORMING AUXILIARY MANAGEMENT FUNCTIONS IN AN ASSOCIATIVE MEMORY DEVICE

BACKGROUND OF THE INVENTION

The present invention relates generally to the field of computer devices, and more specifically concerns apparatus which performs data management functions within a data search device, and which, in response to requests from a computer, controls the storage, retrieval, and modification of data in peripheral memory.

In U.S. Pat. No. 3,906,455, titled Associative Memory Device, which is assigned to the same assignee as that of the present invention, apparatus is disclosed and claimed which is asynchronously responsive to a request from a using computer to locate and retrieve information which is stored in peripheral memory. The peripheral memory may be a mass storage device, such as a Block Oriented Random Access Memory (BORAM).

As is stated in the '455 patent, peripheral memory is often a necessary addition to existing digital computers. Many data bases to which a computer must have access in order to execute particular applications exceed $10^6$ characters. Such data bases cannot be practically stored in computer main memory, primarily because of cost, and hence are stored in less expensive peripheral memory. Peripheral mass memory, such as discs and drums, are relatively inexpensive, but retrieval of stored data is slow when the memory is searched sequentially, which is typically the case. Retrieval time may be improved by either: (1) uniquely addressing each record in peripheral memory and then indexing that address in software; or (2) searching each record in peripheral memory simultaneously, i.e. by a parallel search. This type of simultaneous search is referred to hereinafter as a true associative search.

The first solution above is expensive because of its high use of computer resources and supporting manpower. This is especially true for large data bases, since the indexing process quickly becomes extremely complicated as data is moved in and out of the peripheral memory. The second solution has been found to be impractical and hence unsatisfactory, because of the high cost of the hardware necessary to search all the records in the peripheral memory simultaneously.

In the '455 patent, a device referred to as an associative memory device was disclosed and claimed which combined the principles of sequential and parallel searching, by dividing the peripheral memory into groups of memory elements, e.g. track groups. The associative memory device is operative to search the data contained in a particular track group simultaneously, and to search the track groups comprising a search area sequentially.

The number of data tracks comprising a track group depends upon the cost restraints placed upon the design of the search device. Generally, the more data which is searched in parallel, and hence the faster the search, the more logic is required and hence, the higher the cost of the search apparatus. Hence, there is a tradeoff between retrieval time and cost in the design of each search apparatus.

In the '455 patent, however, system data management functions of the associative memory device, such as controlling the queuing of the requests from using computers, the sequencing of the various search operations, and the controlling of the movement of data between peripheral memory and the using computer, were not disclosed in detail, but rather were understood to be performed by software existing within the using computers in combination with some additional conventional hardware.

It has been found, however, that the control and implementation of data management functions by software has significant disadvantages, particularly in the associative memory device of the '455 patent. Performing such functions by software frequently results in duplicative data management programs in the using computers as well as making data base management, particularly updating, more difficult and cumbersome.

The present inventors have hence found it desirable to find an alternative to such traditional software means for controlling and implementing data management functions in an associative memory device.

In view of the above, it is a general object of the present invention to provide a data management apparatus which overcomes one or more of the disadvantages of the prior art discussed above.

It is another object of the present invention to provide such a data management apparatus which may be conveniently used with an associative memory device such as that disclosed in the '455 patent.

It is an additional object of the present invention to provide such a data management apparatus which is relatively inexpensive.

It is a still further object of the present invention to provide such a data management apparatus which is designed to accomplish a large number of special purpose data management functions by combining in specified sequences a relatively few general-purpose data management functions.

It is an additional object of the present invention to provide such a data management apparatus which controls the simultaneous access of several using computers, and/or of several applications on one using computer, to peripheral memory without creating logical inconsistencies in the data stored in the peripheral memory.

It is yet another object of the present invention to provide such a data management apparatus which is capable of quickly and accurately locating and retrieving information in peripheral memory, and further, in modifying, deleting and/or storing information in the peripheral memory, as well as adding and/or deleting data management information to selected blocks of data.

It is a still further object of the present invention to provide such a data management apparatus which performs other data management functions, including initialization of memory areas, unloading and loading of data in memory areas, and maintaining a record of available space in peripheral memory.

SUMMARY OF THE INVENTION

Accordingly, an apparatus is provided which is capable of performing a plurality of data management functions for a data retrieval device, such as an associative memory or the like, with the data retrieval device being operative to retrieve data from a peripheral memory in response to a search request received from a digital computer. The apparatus includes, briefly, a control section operative to program the data retrieval device in accordance with the instructions which form a part of the search request from the digital computer, an information carrying line, known as a bus, an interface which transfers information between the digital computer and the bus, and an input/output section which includes a buffer which temporarily stores data so that the format of the data may be altered appropriately to that of the destination of the data, and a selector device which locates specified physical locations or addresses in the peripheral memory. The bus is connected to the interface, the control section, the buffer and the selector device, so that data, search requests, control data, and the like may be passed appropriately between the various elements of the apparatus. The buffer means is operative to store data both prior to its transmission to a selected destination in the peripheral memory and subsequent to its retrieval therefrom for transmission to the using computer, either directly or through the control section.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

In current peripheral memories, the storage medium typically is a rotating drum or disc. These rotating drum and disc memories are comprised of a plurality of data tracks, in which data is stored in sequence. Each data track is typically divided, for addressing purposes, into a number of equal-length portions referred to as sectors.

The data to be recorded typically takes the form of logical records, the length of which is defined by a using computer program and which is independent of the physical length of a track sector. Within a particular memory area, which comprises a defined number of data tracks, the length of a logical record will usually be fixed. Each logical record is a block of data possessing a degree of logical completeness. For instance, if a personnel file forms a data base in peripheral memory, a logical record might comprise the personnel information on a particular individual in the file.

Each logical data record may be further divided into a plurality of data fields, with each data field containing a distinct piece of information. In the example above, each data field in a given logical data record will contain specific information about a particular person, e.g. age, height, weight, etc. Logical data records and data fields are hence data-related and not address-related, as are data tracks and track sectors. A single logical data record may occupy a portion of, or more than one, track sector of a particular data track. The length of the data fields comprising each logical data record will vary, depending upon the information contained in that field, although the length of data fields will usually be fixed for a given data base.

As described above, a data base could be searched sequentially or it could be searched in parallel to retrieve a particular logical data record. In a true sequential search, the logical data records comprising the data base are searched one after another. In most cases, only those data fields in each logical data record are searched which contain data of the kind specified by the using computer in its search specification for retrieval of particular record(s), i.e. if the search specification were directed toward a specific individual in a personnel data base, only that field in each logical data record containing the person's name would be searched.

In a true parallel search, referred to hereinafter as a true associative search, on the other hand, those field or fields in each logical data record in the data base which contain the kind of information specified by the using computer in its search specification, e.g. the person's name, are searched simultaneously. This is accomplished by logic circuits present within the associative search controller, such as those disclosed in the '455 patent. The search specification from the using computer may, of course, be more complicated than that suggested above, i.e. it may specify a range of acceptable values for one or more data fields.

Figure 1:
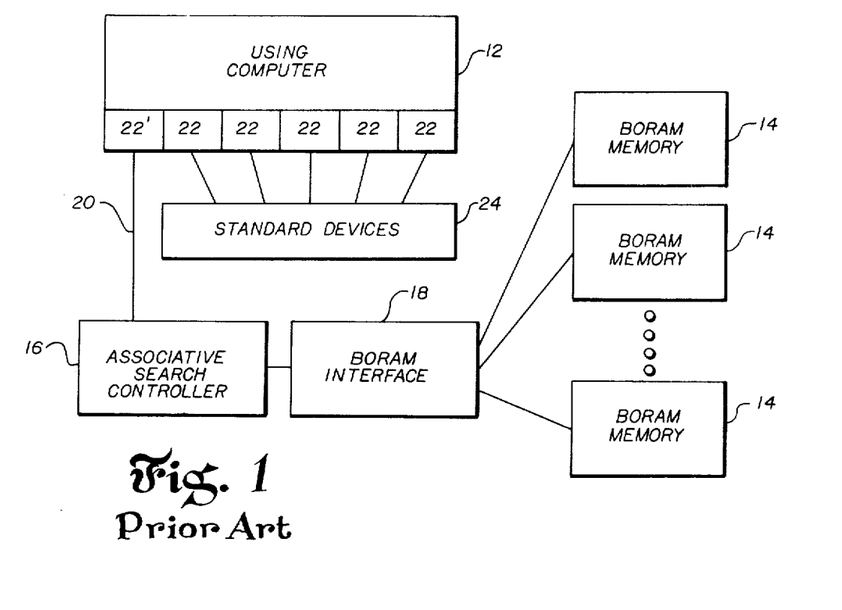
FIG. 1 is a block diagram showing a generalized structural arrangement of an associative memory device with a using computer and a peripheral memory.

Referring now to FIG. 1, a single using computer 12 is shown as connected to one or more peripheral memories, shown as BORAM memories 14—14, through an associative search controller 16 and a BORAM interface 18. Associative search controller 16 is connected to using computer 12 by a connecting line 20 through a computer selector channel 22', which is one of a plurality of selector channels 22—22. One or more of the remaining selector channels may be connected to standard peripheral devices, which are represented figuratively as a group at 24 in FIG. 1. The apparatus shown generally in FIG. 1 forms the structural context of the present invention, which operates with the associative search controller 16, but is not shown specifically in FIG. 1.

It should be understood that although the present invention is particularly useful in a system which includes a BORAM memory, as disclosed in more detail in the '455 patent, such a specialized memory is not necessary for proper operation of the present invention, and conventional peripheral memories such as rotating drums, discs, and floppy discs, may be conveniently used, although additional time to perform a particular function would probably be necessary.

Figure 2:
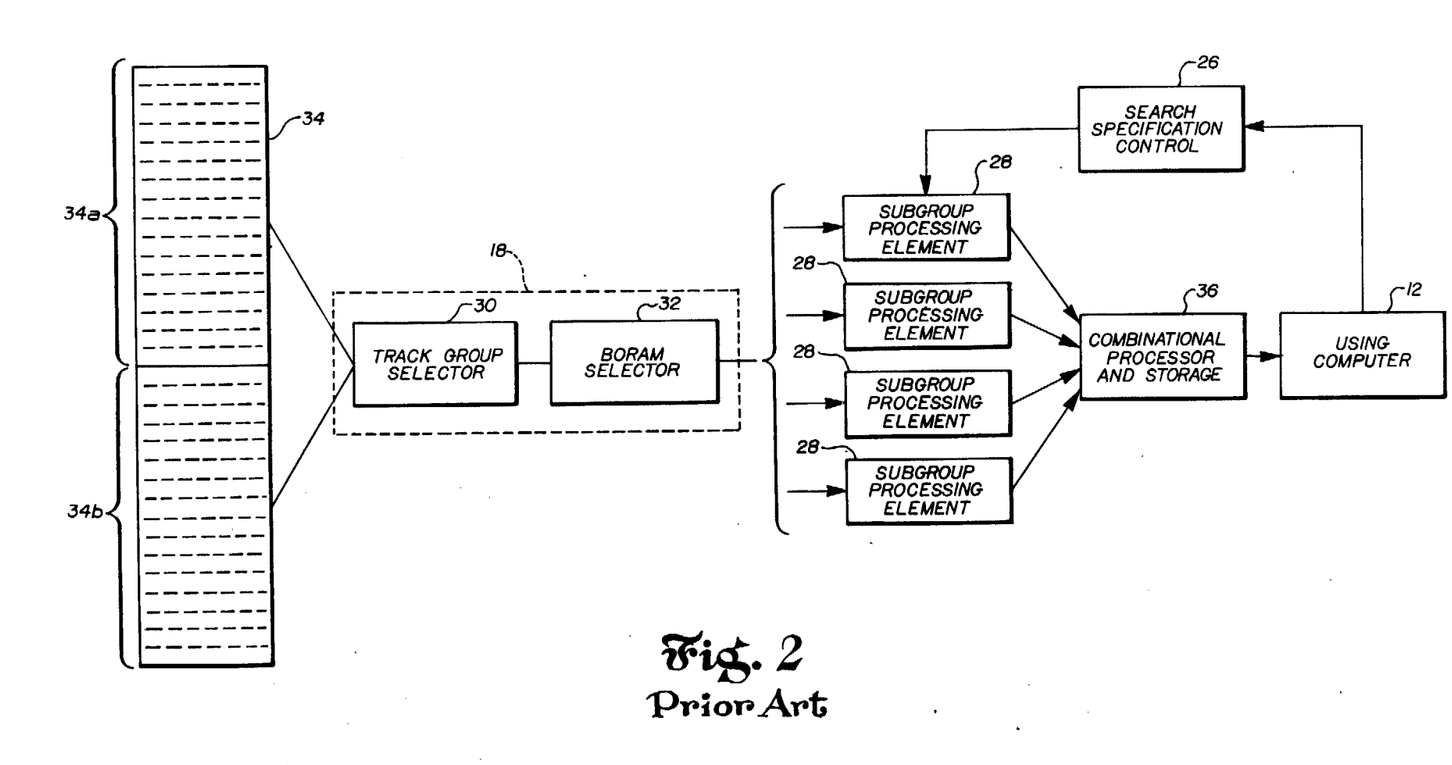
FIG. 2 is a block diagram showing in more detail a portion of the structure of FIG. 1.

FIG. 2 discloses in more detail the associative search controller 16 of FIG. 1. A request from using computer 12 will, as stated above, include a search specification, which specifies the data fields in each logical data record to be searched, and selects the search criteria for each specified data field.

The following search criteria are used by the search controller: (1) greatest; (2) least; (3) greater than; (4) greater than or equal to; (5) less than; (6) less than or equal to; (7) not equal; and (8) equality. Many of the above search criteria may be implemented conjunctively to provide specialized search criteria for selected data fields. Generally, the order in which the search criteria for a given data field is implemented is of no consequence, except for the criteria of: (1) greatest; and (2) least, which must be implemented on a second pass of the data after the other selected search criteria have been implemented.

Referring still to FIG. 2, the search specification is transferred from using computer 12 into a set of registers in search specification control section 26. The associative search of the data base is performed in accordance with the search criteria and under the control of the established logic in the associative search controller, which determines the order and the manner in which the individual logical data records in the data base are searched.

The searching, or interrogation, of the logical data records in the data base is accomplished by a plurality of subgroup processing elements 28—28, which form a portion of associative search controller 16. BORAM interface 18 controls the order of presentation of the logical data records to the subgroup processing elements. BORAM interface 18 generally comprises a track group selector 30 and a BORAM selector 32. A particular BORAM 34 is shown in FIG. 2. BORAM selector 32 is responsible for sequentially selecting the individual BORAMS (or other memory device) to be searched, while track group selector 30 sequentially selects for searching the track groups in each BORAM.

As disclosed in the '455 patent, the memory area to be searched, e.g. BORAM 34 plus several other BORAMS or portions thereof, is divided into a plurality of track groups, each track group comprising a selected number of data tracks. The data in each track group is searched in parallel, one track group at a time. BORAM 34 in FIG. 2 is divided into two track groups 34a and 34b, each track group containing a selected number of individual data tracks, e.g. 16 in FIG. 2.

Each track group 34a and 34b is further typically divided into a number of subgroups, with each subgroup containing the same number of data tracks. The size of the subgroup depends upon the number of subgroup processing elements selected for the system. The more subgroup processing elements 28, the greater the number of data tracks which may be included in a track subgroup, and hence, the larger the track group may be, resulting in a faster search, because it is closer to a true associative, i.e. simultaneous, search of all the records in the data base.

It is the function of track group selector 30 and BORAM selector 32 to properly sequence the various memory devices and their constituent track groups, which form a memory area, in proper order to subgroup processing elements 28—28. The number of subgroup processing elements 28 will be equal to the number of track subgroups in a single track group. Each subgroup processing element 28 is capable of simultaneously processing a specified number of data tracks, i.e. the number of data tracks comprising a track subgroup. Hence, all of the data tracks in a particular track group are processed simultaneously.

The results of the search accomplished by each subgroup processing element, i.e. the identification of the record or records in each track subgroup which best meet the search specification, are applied to combinational processor and storage element 36. For simplicity, combinational processor 36 is shown as a single element, but in reality comprises a series of elements which combine processing results from subgroups, then from track groups, and then from other BORAMS. After the entire data base has been searched, the information stored in combinational processor and storage element 36 contains either the actual logical record, or its address, which best meets the search specifications in the entire data base. This information is then transferred to using computer 12.

Figure 3:
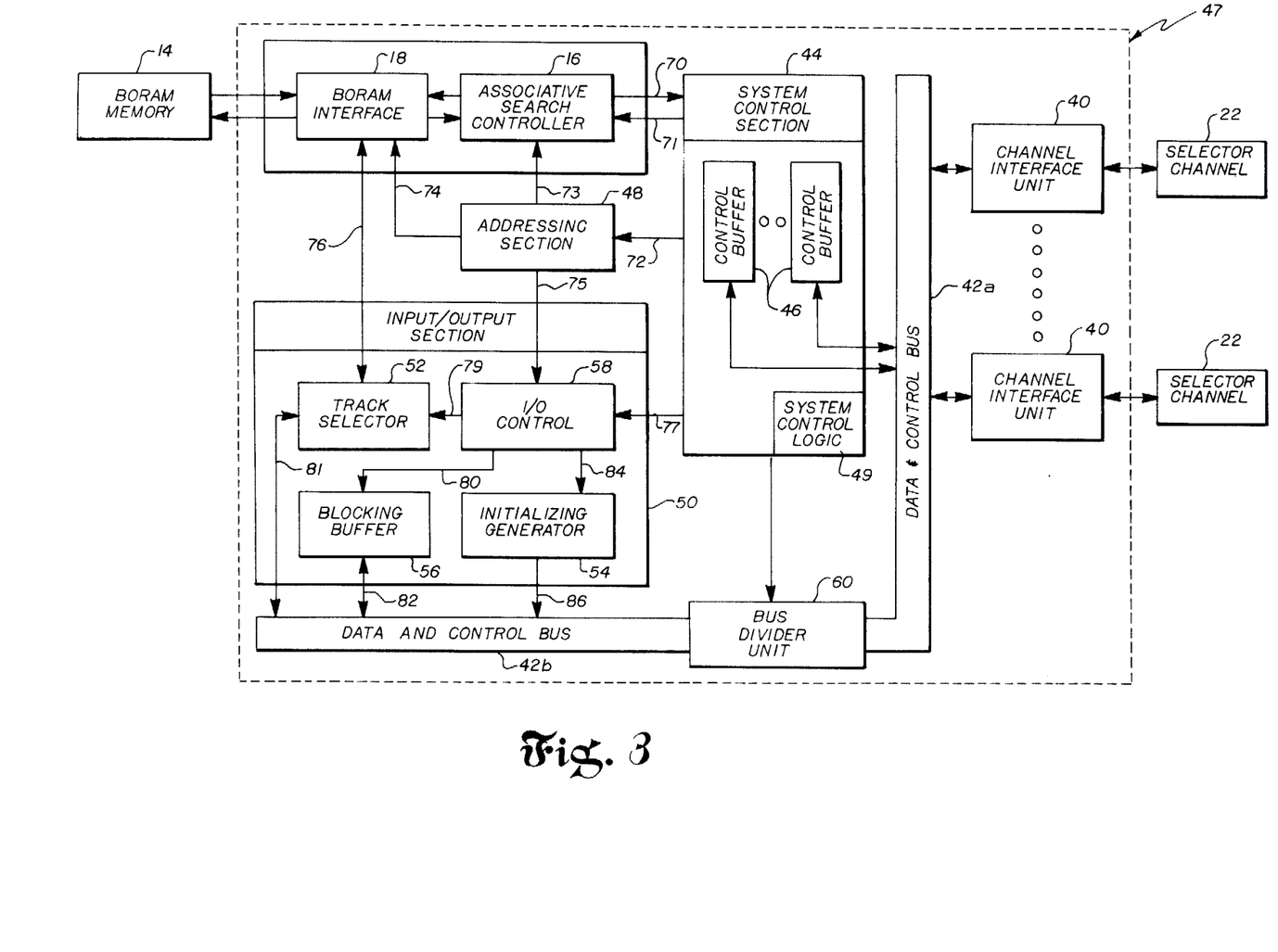
FIG. 3 is a block diagram showing the structure of the present invention, and its interface with certain portions of the structure of FIG. 1.

However, a substantial number of data management functions are left unaccounted for by the structure of FIGS. 1 and 2 as disclosed in the '455 patent. Referring now to FIG. 3, the apparatus of the present invention is disclosed in its functional working relationship with an associative search controller 16, a BORAM interface 18, selector channels 22—22 of a using computer (not shown), and a single peripheral memory 14. The present invention is directed toward an apparatus for accomplishing, in a convenient and inexpensive manner, all of the data management functions necessary for proper operation and control of the associative memory device disclosed and claimed in the '455 patent, and discussed briefly above.

Briefly, the apparatus of the present invention includes a series of channel interface units 40—40 connected both to corresponding selector channels 22—22 on a using computer (not shown) and through a data and control bus section 42a to a system control section 44, which includes a plurality of control buffers 46—46.

An addressing section 48 assumes some of the addressing functions disclosed in the '455 patent as well as additional new addressing functions disclosed below. Addressing section 48 is responsive to system control section 44 to provide address information to associative search controller 16, BORAM interface 18, and an input/output section 50.

Input/output section 50 includes several additional elements, including a track selector 52, an initializing generator 54, a blocking buffer 56, and an I/O control section 58. I/O control section 58 is responsive to commands and data from system control reaction 44 and addressing section 48 to control the other elements of input/output section 50. Track selector 52, initializing generator 54 and blocking buffer 58 all communicate with control buffers 46—46 in system control section 44 through a transmission path comprising data and control bus section 42b, bus divider unit 60, and data and control bus section 42a. Bus divider unit 60 operates under the control of system control section 44 to selectively connect data and control bus sections 42a and 42b so that they operate as a unit.

The apparatus shown in FIG. 3 is operative to control the storage, format, location, retrieval and modification of logical data records, as well as controlling the associative search itself, which is performed by associative search controller 16 in accordance with the search principles noted above. The structure and function of each element described briefly above and shown in FIG. 3 for performing the data management operations will be described in detail in following paragraphs.

Referring again to FIGS. 1 and 3, the combination of associative search controller 16, BORAM interface 18, and the apparatus of the present invention is referred to as an extended associative controller 47. In a typical installation, extended associative controller 47 is responsive to perhaps two using computers, and possibly as many as five or six, with each using computer having several selector channels for use therewith.

Channel interface unit 40 is conventional in construction, and may be readily constructed using off-the-shelf items. The function of channel interface unit 40 is to transfer data in the form of search specifications and data management requests from a using computer to system control section 44. In response to a request from a using computer through a selector channel 22, channel interface unit 40 directs an interrupt signal to system control section 44. System control section 44, in accordance with its established operating schedule, responds to the interrupt signal and the data from the using computer is transferred into one of a plurality of control buffers 46.

System control section 44 is also conventional in its construction and comprises a plurality of control buffers 46—46, and a relatively small logic section 49. Logic section 49, which may take the form of a micro-processor, generates specific control instructions, as will be seen hereinafter, to other portions of the extended associative controller 47 in response to a particular request from a using computer.

In operation, system control section 44 maintains a queue of requests generated by using computers. Only one such request is processed at any one time by extended associative controller 47. Typically, the request from a using computer will necessitate some type of search of peripheral memory 14 so that there results an exchange of data and search specifications over lines 70 and 71 between system control section 44 and associative search controller 16. Addressing information is transferred from system control section 44, where it is initially stored in control buffers, to addressing section 48 over control line 72.

Control buffers 46—46 in system control section 44 communicate with channel interface units 40—40 by means of data and control bus section 42a. Data and control bus section 42a is conventional in construction and may be readily constructed from off-the-shelf items. It operates essentially as a conductive interface for a variety of data referred to generally in the claims as information, such as actual record data, search requests, control information, etc. between channel interface units 40—40 and control buffers 46—46.

Figure 4:
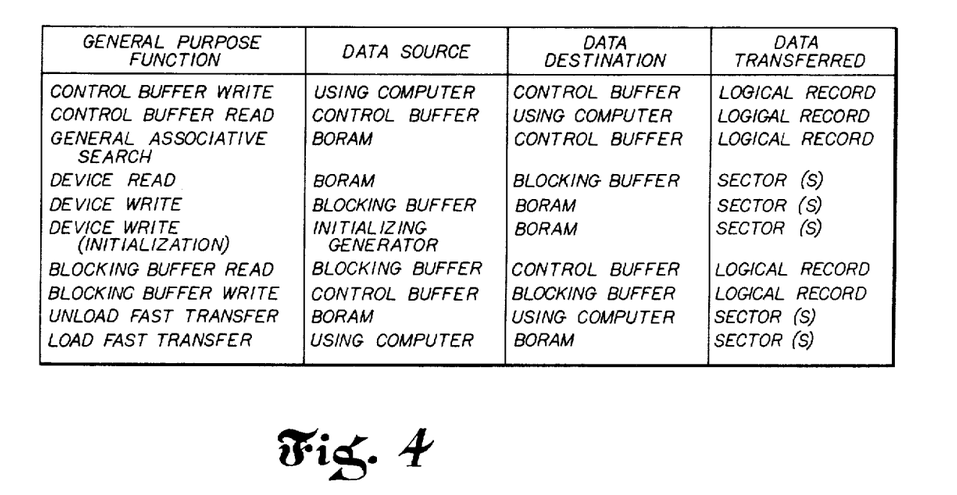
FIG. 4 is a table which lists the general-purpose data management functions accomplished by the apparatus of the present invention, and information related thereto.

In operation, system control section 44 will, in response to an interrupt signal from channel interface unit 40 through data and control bus section 42a, initiate a transfer of the request and associated data from the using computer through the selector channel 22 and channel interface unit 40 into a control buffer 46. This particular data transfer is referred to as a CONTROL BUFFER WRITE general-purpose function (FIG. 4).

The term general-purpose function refers to a number of specified operations performed by the data management apparatus of the present invention which may be combined in various sequences to accomplish a plurality of specific functions requested by using computers. A wide variety of specific functions, as shown hereinafter, may thus be implemented with the relatively simple structural arrangement of the present invention. Improvement in both cost and performance is achieved with the present invention over more conventional data management techniques.

When a record retrieval function has been completed by the extended associative controller 47, the record will be present in a particular control buffer 46. This record may then be transferred, via control bus section 42a and channel interface unit 40, to the using computer. This transfer of data from system control section 44 to the using computer's storage through channel interface unit 40 is another general-purpose function, referred to as a CONTROL BUFFER READ (FIG. 4).

Associative search controller 16, in response to a request from system control section 44 over control line 70, will perform the associative search in accordance with the search specifications established by a using computer, as outlined above, and as explained in detail in the '455 patent. The search performed by associative search controller 16 is referred to as a GENERAL ASSOCIATIVE SEARCH and is the third general-purpose function (FIG. 4) performed by the apparatus of the present invention shown and described herein.

Extended associative controller 47 includes, as noted above, an addressing section 48, which comprises a series of conventional registers which store data location information, and range and boundary information for a given search. Addressing section 48 includes a number of registers previously disclosed as forming a part of associative search controller 16, as well as several additional registers not previously disclosed, including a track address register, a sector address register and a sector count register, which are necessary, as explained further below, for the accomplishment of certain additional general-purpose functions.

Addressing section 48 receives information from system control section 44 over control line 72, and in turn supplies address information to associative search controller 16 over control line 73, to BORAM interface 18 over control line 74, and to I/O control section 48 of input/output section 50 over control line 75.

In input/output section 50, track selector 52 receives control information from I/O control section 58 over line 79, communicates with BORAM interface 18 over line 76 and transfers data to and from control bus section 42b over line 81. Blocking buffer 56 receives control information from I/O control section 58 over line 80 and transfers data to and from control bus section 42b over line 82. Initializing generator 54 receives control information from I/O control section 58 over line 84, and transfers data to and from control bus section 42b over line 86.

Track selector 52, which may be a series of multiplexers and demultiplexers, under the control of the track address and sector address registers (not shown) in addressing section 48, is operative to select a specific data track and sector(s) on a BORAM, so that data may be transferred between one data track on BORAM 14 and blocking buffer 56 through BORAM interface 18, track selector 52, and data and control bus section 42b. In addition, data may be directly transferred between BORAM 14 and the using computer, through BORAM interface 18, track selector 52, data and control bus sections 42b and 42a, bus divider unit 60 and channel interface unit 40. The track address, sector address and sector count registers thus provide the apparatus of the present invention with a capability of addressing BORAM 14 without the intervention or assistance of the associative search controller 16.

Blocking buffer 56, which includes a temporary storage device in the form of a Random Access Memory (RAM), assists in the transfer of data between the using computer and the peripheral memory. When data is to be stored on BORAM memory 14 by means of the data management apparatus of the present invention, it is initially stored in one or more control buffers 46 by means of a CONTROL BUFFER WRITE general-purpose function. The address where the data is to be stored on BORAM memory 14 is concurrently established in addressing section 48.

Transfer of data is accomplished between a control buffer 46 and blocking buffer 56 through data and control bus section 42a, bus divider unit 60, and data and control bus section 42b. Data is transferred between control buffer 46 and blocking buffer 56 in the form of logical data records. This is another general-purpose function, referred to as BLOCKING BUFFER WRITE (FIG. 4). Conversely, when data is transferred from blocking buffer 56 to a control buffer 46, from where it may be transferred to a using computer, it is referred to as a BLOCKING BUFFER READ general purpose function (FIG. 4).

As stated above, data transferred between a control buffer 46 and blocking buffer 56 is in the form of logical records. However, data transferred between BORAM memory 14 and blocking buffer 56 is in the form of sectors of data, a sector being the smallest physically addressable unit on BORAM memory 14. Thus, the primary purpose of blocking buffer 56 is to block and/or unblock data from a sector format to a logical record format, and vice-versa. Again, blocking buffer 56 may be readily constructed from standard elements to perform such a function. Generally the length of blocking buffer 56 is an integral multiple of the sector size and must accommodate both the size of the sectors and the maximum length of a logical record.

The transfer of data between blocking buffer 56 and BORAM memory 14 will, as pointed out above, be in the form of sectors of data, and will use a transmission path comprising data and control bus section 42b, track selector 52, and BORAM interface 18. The physical location on BORAM 14 where the data is to be stored and/or retrieved is addressed by track selector 52, under the control of the address, sector and sector count registers in addressing section 48.

The transfer of data from BORAM memory 14 into blocking buffer 56 is a general-purpose function referred to as a DEVICE READ, while transfer of data from blocking buffer 56 to BORAM memory 14 is referred to as a DEVICE WRITE general purpose function (FIG. 4).

Since the transfer of data in the form of logical records between blocking buffer 56 and control buffer 46 will typically not conform to the boundaries of data in the form of sectors transferred between BORAM memory 14 and blocking buffer 56, the general-purpose functions BLOCKING BUFFER READ and BLOCKING BUFFER WRITE will begin at a location in blocking buffer 56 which is removed or offset some distance from the start boundary of the blocking buffer. The amount of offset is computed by system control section 44 at the time it initiates the BLOCKING BUFFER READ or BLOCKING BUFFER WRITE functions, and this offset command is transferred to I/O control section 58 over line 77, which in turn controls the read and write operations associated with blocking buffer 56.

Initializing generator 54 is also under the control of I/O control section 58 over line 84. Occasionally, it will be necessary to transfer a fixed data value, such as all zeroes, into a particular set of one or more data tracks on BORAM memory 14. This is accomplished by initializing generator 54, which comprises a conventional register containing the specified fixed data value, or may comprise a stored program in I/O control section 58. In response to a proper command from I/O control section 58 over line 84, the fixed data value in initializing generator 54 is non-destructively transferred to the specified data tracks in BORAM memory 14. Hence, the fixed data value remains in initializing generator 54. This is another general-purpose function, referred to as a DEVICE WRITE INITIALIZATION (FIG. 4).

Data may also be transferred directly from BORAM memory 14 to the using computer, i.e. from BORAM memory 14 through BORAM interface 18, track selector 52, data and control bus section 42b, bus divider unit 60, and data and control bus section 42a, to control interface unit 40. Data hence may be conveniently unloaded from BORAM memory 14 for backup recording purposes, and this general-purpose function is referred to as an UNLOAD FAST TRANSFER. The corresponding LOAD TRANSFER general-purpose function refers to the transfer of the previously unloaded data back to its original location in BORAM memory 14 after the backup recording has been performed.

The remaining portion of extended associative controller is bus divider unit 60, which is controlled by system control section 44. Bus divider unit 60 essentially comprises two transceivers, one for each bus section, and a gate under the control of control section 44 which selectively connects the two transceivers together so that data and control bus sections 42a and 42b operate as a single unit.

Bus divider unit 60 permits data and control bus sections 42a and 42b to be operated either independently, or as a single unit. When data and control bus sections 42a and 42b are being used independently, general-purpose functions accomplished between channel interface unit 40 and system control section 44 use data and control bus section 42a, while general-purpose functions accomplished between various sections of input/output section 50 and BORAM memory 14 use data and control bus section 42b. However, several other general-purpose functions, namely BLOCKING BUFFER READ, BLOCKING BUFFER WRITE, and UNLOAD/LOAD FAST TRANSFER require that data and control bus sections 42a and 42b be used as a single unit, which is accomplished by bus divider unit 60.

The physical format of the logical record data manipulated by the data management apparatus of the present invention is somewhat altered from that disclosed in the '455 patent, and significantly assists in the accomplishment of the data management functions. As stated above, a logical record comprises a unit block of data, such as information concerning one person in a personnel file. Each logical record is further divided into data fields, which each contain a specific portion of the information in the logical record, such as the person's age, in the above example.

Under the physical data format arrangement of the present invention, one or more data fields, usually the first fields of a logical record, are reserved for logical record control information, which is in turn used by system control section 44 to manage the record. These additional fields are referred to as control fields. One control field is always present and is referred to as the flag field, while the other control field is referred to as an identifier field, when it is present. A logical record may contain zero, one or more identifier fields.

These control fields, although forming a part of each logical record when they are stored on BORAM memory 14, are not a part of the logical record transmitted to or from the using computers. They are added and removed by system control section 44 during processing of the logical record. The using computers are hence completely unaware of the control fields.

The flag field has two specific purposes. The value in the flag field 1) indicates whether the logical record contains active data, or alternatively, whether the space is available for new record data; and 2) states the reservation criteria of the logical record.

If the flag field contains what is referred to as a free record value, which in most cases is all zeroes, the logical record space is available to receive new data. Any other value present in the flag field indicates that the record space contains usable information and hence is unavailable for new data.

By use of reservation criteria, more than one using computer is able to simultaneously utilize a particular logical record in a controlled fashion. Heretofore, it has been undesirable that more than one using computer have simultaneous access to a particular logical record, because of the subsequent lack of control over the contents of the record. When more than one using computer has simultaneous unrestrained access to a particular logical record, changes to the logical record may be made by each using computer independently, without the knowledge of other using computers. This usually creates significant data management problems, such as unpredictable inconsistences in the stored data.

The reservation criteria of the flag field in the new record format solves this problem and permits multiple simultaneous use of a single logical record. One system of reservation criteria makes use of three values.

A first value (which must be other than the free record value), referred to as an unreserved value, indicates that the logical record is currently available for use by more than one applicaton (computer program) and hence is not reserved for a particular application.

A second value, referred to as an exclusive value, indicates that the logical record is reserved for exclusive use by a specific application, and hence, access to that logical record by any other application is prohibited.

The third value, referred to as a shared value, indicates that the logical record is presently accessible by at least one application, and also may be used by additional applications.

It should be understood, however, that other systems of reservation criteria may be established, and that the above described embodiment is provided by way of example only.

The identifier field identifies the particular application(s) which have reserved the logical record. If a reservation capability for logical records in a particular memory area is not necessary and/or not desired, then an identifier field is not present in those logical records.

Each reserving application uses one of the available identifier fields for a logical record, as described hereinafter. If more reservations are in force for a particular logical record than there are available identifier fields, then the flag field will contain a notation, known as an overflow shared value, which indicates that there are more application identifications present than can be stored in the available identifier fields. The excess identifications are stored either within system control section memory or on a BORAM area reserved for this particular purpose.

Each identifier field is divided into three sub-fields, a Port ID, an Application ID, and a Record ID. The Port ID identifies the particular channel interface unit through which the reservation of the logical record was made, and as such, identifies the particular using computer reserving the logical record.

The Application ID portion identifies the particular application, within the one previously identified using computer, which has reserved the logical record. This is necessary because one using computer may have as many as five or six or even more applications executing simultaneously which may need to use a particular logical record.

The Record ID portion distinguishes between the several logical records that one particular application may have simultaneously reserved. Hence, the Record ID portion uniquely identifies each logical record reserved by a particular application.

In order to provide a logical record with the correct control fields, system control section 44 uses tree general-purpose functions. The first is a SET general-purpose function, which changes the free record value of a flag field to another value and sets the identifier fields to their appropriate values. The second is a CLEAR general-purpose function, which sets the flag field to the free record value and deletes the using computer application information from the identifier fields, thus making that particular record space available for new data. The third is a MODIFY general-purpose function, which changes the value of the flag field, when it is not initially a free record value, to a new value which is not equal to the free record value. The MODIFY function may also be used to add or delete an identification field.

As stated above, the control fields, although present in the logical records as they are stored on the BORAM memory 14—14, are not known to, specificable by, or processable by, the using computer. The control section adds the control fields to user logical records in the control buffer and removes them before they are returned to the using computer's storage via the channel interface unit 40. The presence of the control fields in no way alters the manner in which the logical records are searched. The control fields appear to the associative search controller as additional data fields. Hence, the presence of these additional fields will also be reflected in the search specification which controls the operation of the associative search controller 16. System control section 44 will extend the using computer's search specifications when appropriate to account for the presence of these additional fields.

The general-purpose functions i.e. FIG. 4, may be used alone to perform particular special-purpose functions, i.e. area functions, over a memory area, or they may be combined in various sequences to perform a number of other special-purpose functions, i.e. logical record functions. A table of both the area functions and the logical record functions is shown in FIG. 5, which lists the sequence of general-purpose functions corresponding to the possible special-purpose functions which may be requested by a using computer.

In most cases, certain general-purpose functions present in every logical record function, such as CONTROL BUFFER WRITE, are not specifically listed. An example of a typical logical record function request is retrieval of a particular logical record, i.e. function C in FIG. 5. A CONTROL BUFFER WRITE (not shown in FIG. 5) general-purpose function transfers the search specification established by the using computer from a channel interface unit 40 to its corresponding control buffer in system control section 44.

System control section 44 then uses the search specification to instruct associative search controller 16 and addressing section 48 concerning the criteria for the search of peripheral memory 14. A GENERAL ASSO- CIATIVE SEARCH general-purpose function is then performed by associative search controller 16 through BORAM interface 18 in accordance with the search specification established by the using computer. When the logical record best meeting the search specification in the memory area is identified, its address in peripheral memory 14 is returned by the associative controller 16 to system control section 44, which then initiates a DEVICE READ general-purpose function. As a result, the one or more sectors containing the best logical record is read into blocking buffer 56. Then the retrieved logical record is read from blocking buffer 56 into a control buffer 46 by a BLOCKING BUFFER READ general-purpose function, and from there to the requesting using computer through the appropriate channel interface unit by a CONTROL BUFFER READ general-purpose function.

Figure 5:
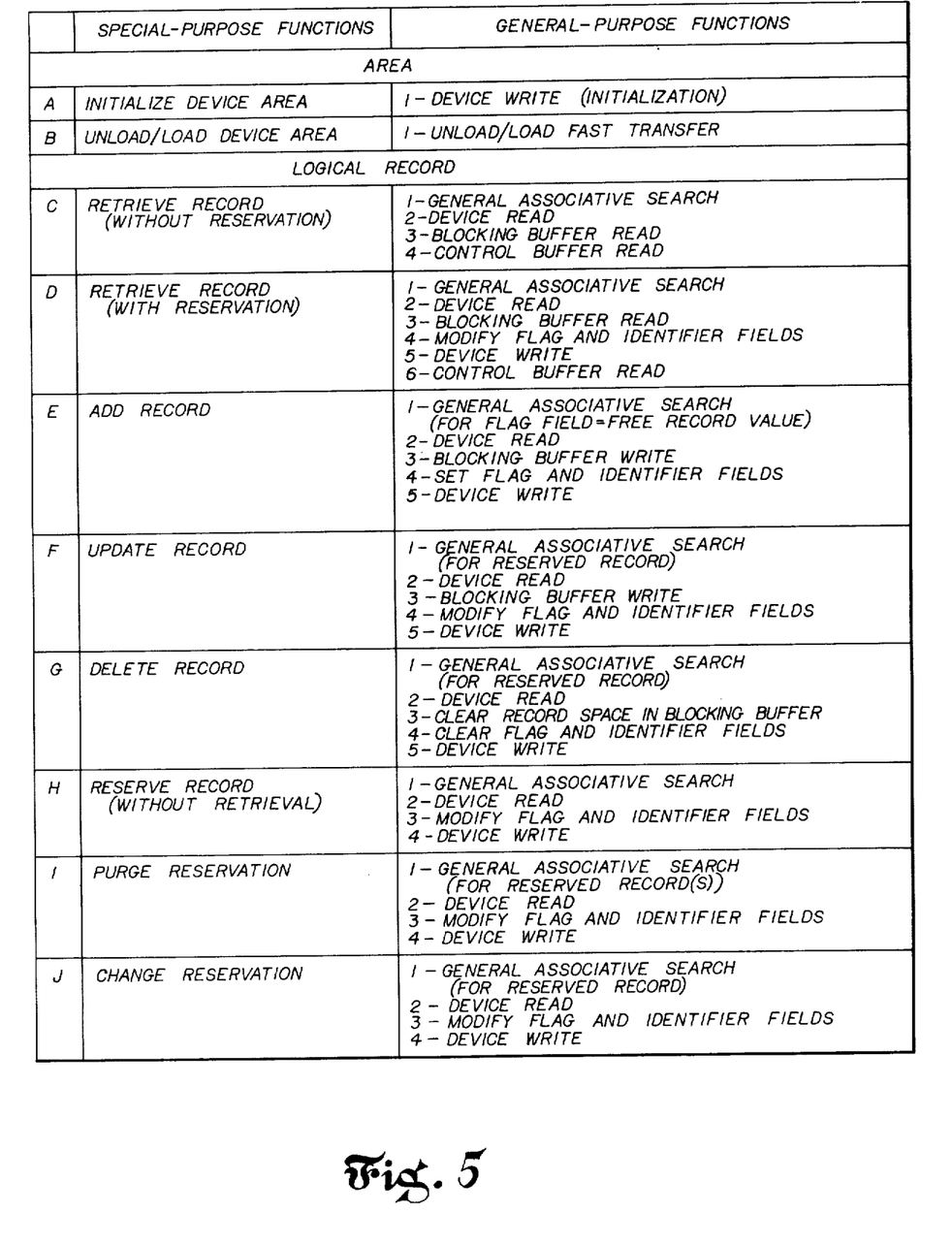
FIG. 5 is a table relating the special-purpose data management functions performed by the apparatus of the present invention to their respective corresponding sequence of general-purpose data management functions.

The other special-purpose functions D-J (FIG. 5), which as a group implement all the anticipated data management functions of extended associative controller 47, also each comprise a particular sequence of general-purpose functions, as shown in FIG. 5. The record retrieval special-purpose functions C and D in FIG. 5 and the reservation special-purpose function H use a GENERAL ASSOCIATIVE SEARCH general-purpose function established by the using computer, while the other special-purpose functions use a limited search established by system control section 44, i.e. a search which relates only to the location of the flag and identifier fields of particular record(s).

The inventors have established a certain order or discipline in which the various special-purpose functions of FIG. 5 are to be accomplished. The discipline has been established for housekeeping purposes, and although not necessarily preferred, it does result in a logical operational sequence of special-purpose functions and insures logical consistency of the stored data.

Under the discipline, the unload/load device area special-purpose functions, because they are intended to be used as a complementary pair for data backup and/or recovery purposes, are exclusive, i.e. no other special-purpose function may be performed against the peripheral memory area while the unload/load device area special-purpose functions are being performed.

The purge reservation and the change reservation special-purpose functions may only be used when there is a prior reservation in effect for the particular logical record against which such special-purpose functions are being performed. The retrieve record (with, and without reservation) special-purpose functions, as well as the reserve record (without retrieval) special-purpose function may be performed without restriction, providing that an initialize device area special-purpose function has been previously performed. The update record and delete record special-purpose functions are only permitted following a retrieve record (with reservation) special-purpose function and must specify the corresponding identifier fields.

The present invention thus comprises a series of elements or sections which are combined in a unique manner so as to be useful in an associative memory device by producing, in operation, a number of general-purpose functions. The general-purpose functions may in turn be combined in various sequences to provide a plurality of special-purpose functions, which in turn provide the data management capability necessary to be fully responsive to the requests from one or more using computers, and to maintain management control over the data base in the peripheral memory.

It should, of course, be understood that a man skilled in the art may make certain changes and modifications to the embodiment disclosed and shown, without departing from the spirit of the present invention, which is defined by the Claims which follow:

What is claimed is:

1. An apparatus for performing data management functions for a data search device which is responsive to a search specification originated by a digital computer to search data that is stored in a memory which is peripheral to the digital computer, wherein the data in the peripheral memory is stored in a first data format of tracks of data which comprise successive data sectors, which are the smallest addressable groups of data in the peripheral memory, said apparatus comprising:

(a) means for receiving from the digital computer a data management request containing at least one of the following: (1) a search specification, and (2) data which is to be stored in the peripheral memory, wherein the data received from the digital computer is in a second data format of a series of logical records, wherein said receiving means includes means for temporarily storing the data management request;

(b) first connecting means for passing the search specification to the data search device;

(c) means for storing the address of the location of a particular sector of data in the peripheral memory containing a particular logical record found by the data search device to satisfy the search specification;

(d) means for retrieving data from, and writing data into, the peripheral memory in the first data format, including means responsive to said address storing means for retrieving the particular data sector from the peripheral memory which contains the particular logical record;

(e) means for reformatting data originally in the first data format into the second data format, and for reformatting data originally in the second data format into the first data format, including means for extracting the particular logical record from the remainder of the particular sector of data;

(f) second connecting means for passing data in the first data format between said reformatting means and said data retrieving and writing means;

(g) third connecting means for passing the data which has been received in said receiving means from the digital computer to said reformatting means; and (h) fourth connecting means for passing the particular logical record from said reformatting means to said receiving means, from where it is passed to the digital computer in satisfaction of the search specification.

2. An apparatus of claim 1, including means for transferring data in the first data format directly between the digital computer and said data retrieving and writing means.

3. An apparatus of claim 2, wherein said sectors of data are of known length, and a maximum length of a digital record is pre-established, and wherein said reformatting means includes data storage means of sufficient size to accommodate either a sector of data or a logical record.

4. An apparatus of claim 3, wherein said data storage means is an integral multiple of the length of a sector of data.

5. An apparatus of claim 3, wherein said apparatus is responsive to a plurality of digital computers and includes fifth connecting means for passing data management requests from said plurality of digital computers to said receiving means, and wherein said receiving means includes a plurality of buffer storage means and a control means for prioritizing said data management requests in accordance with an established priority.

6. An apparatus of claim 5, including interface means connected between each digital computer and said fifth connecting means, wherein said interface means includes means for producing an interrupt signal, which is passed to said receiving means, upon initiation of a data management request from one of said plurality of digital computers.

7. An apparatus of claim 1, including means for an initializing a location in the peripheral memory with a pre-existing set of data, and further including sixth connecting means connecting said initializing means with said reformatting means.

8. An apparatus of claim 7, including first and second independent data buses, wherein said first data bus includes a portion of said second and sixth connecting means, wherein said second data bus includes a portion of said fifth connecting means, and wherein said apparatus includes means selectively connecting said first and second data buses to form a unitary data bus, wherein said unitary data bus includes portions of said third and fourth connecting means.

9. An apparatus of claim 1, wherein each logical record received from the digital computer comprises a plurality of data fields, and wherein said receiving means includes means for (1) adding at least one control field to each logical record after said each logical record has been received from the digital computer, and (2) deleting any control fields previously added to a logical record prior to the transmission thereof back to the digital computer, wherein said control field contains information concerning the desired operational status of the logical record to which it is added.

10. An apparatus of claim 9, including means for altering the control field of a given logical record to reflect a change in the desired operational status of the given logical record.

* * * * *

UNITED STATES PATENT AND TRADEMARK OFFICE
CERTIFICATE OF CORRECTION

PATENT NO. : 4,115,850
DATED : September 19, 1978
INVENTOR(S) : Houston, et al

It is certified that error appears in the above—identified patent and that said Letters Patent are hereby corrected as shown below:

Assignee: The Boeing Company, Seattle, Washington

Attorneys: Cole, Jensen & Puntigam P.S.

Signed and Sealed this

Thirty-first Day of July 1979

[SEAL]

Attest:

Attesting Officer

LUTRELLE F. PARKER
*Acting Commissioner of Patents and Trademarks*